(12) United States Patent
Biber

(10) Patent No.: US 11,287,496 B2
(45) Date of Patent: Mar. 29, 2022

(54) IDENTIFYING DEFECTIVE DETUNING CIRCUITS IN A MAGNETIC RESONANCE TOMOGRAPHY UNIT

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/016,315

(22) Filed: Sep. 9, 2020

(65) Prior Publication Data

US 2021/0088608 A1 Mar. 25, 2021

(30) Foreign Application Priority Data

Sep. 23, 2019 (EP) ..................................... 19198911

(51) Int. Cl.
*G01R 33/36* (2006.01)
*G01R 35/00* (2006.01)

(52) U.S. Cl.
CPC ..... *G01R 33/3628* (2013.01); *G01R 33/3607* (2013.01); *G01R 35/00* (2013.01)

(58) Field of Classification Search
CPC ............ G01R 33/3628; G01R 33/3657; G01R 33/341; G01R 33/546; G01R 33/288; G01R 33/583; G01R 35/00
USPC ........................................................ 324/307
See application file for complete search history.

(56) References Cited

U.S. PATENT DOCUMENTS

| 2005/0134277 | A1* | 6/2005 | Matschl | ............. | G01R 33/3657 |
| | | | | | 324/322 |
| 2008/0136418 | A1* | 6/2008 | Renz | ..................... | G01R 33/365 |
| | | | | | 324/322 |
| 2009/0302845 | A1 | 12/2009 | Biber | | |
| 2012/0086451 | A1* | 4/2012 | Eberler | .............. | G01R 33/3657 |
| | | | | | 324/318 |
| 2016/0216345 | A1* | 7/2016 | Greim | ................ | G01R 33/3642 |
| 2017/0205481 | A1* | 7/2017 | Kim | ................... | G01R 33/3657 |
| 2018/0329003 | A1 | 11/2018 | Nistler | | |

FOREIGN PATENT DOCUMENTS

DE 102008026849 A1 12/2009
EP 3287805 A1 2/2018

OTHER PUBLICATIONS

European Search Report for European Application No. 19198911.0-1010 dated Mar. 27, 2020.

* cited by examiner

*Primary Examiner* — Christopher P McAndrew
(74) *Attorney, Agent, or Firm* — Lempia Summerfield Katz LLC

(57) ABSTRACT

A method for checking a detuning facility of an antenna coil of a magnetic resonance tomography unit, and a magnetic resonance tomography unit for carrying out the method are provided. In the method, a detuning facility of the antenna coil is activated. A first receive signal and a second receive signal are received. The first receive signal and the second receive signal are compared, and a warning signal is output depending on a result of the comparison.

12 Claims, 3 Drawing Sheets

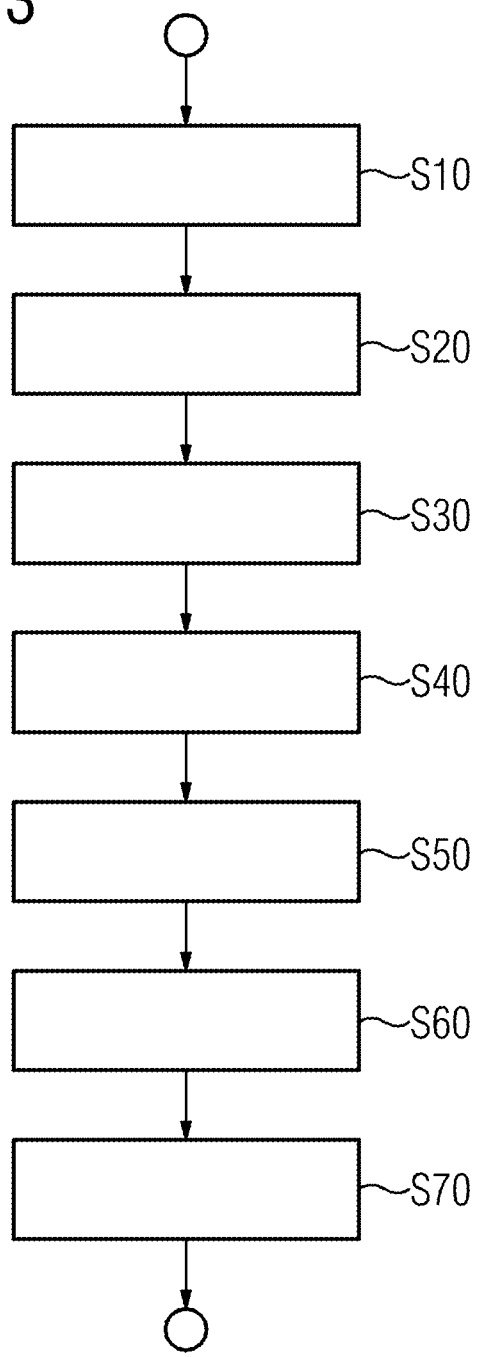

IDENTIFYING DEFECTIVE DETUNING CIRCUITS IN A MAGNETIC RESONANCE TOMOGRAPHY UNIT

This application claims the benefit of European Patent Application No. EP 19198911.0, filed on Sep. 23, 2019, which is hereby incorporated by reference in its entirety.

BACKGROUND

The present embodiments relate to checking a detuning facility of an antenna coil of a magnetic resonance tomography unit.

Magnetic resonance tomography units are imaging apparatuses that align nuclear spins of the examination object with a strong external magnetic field for imaging of an examination object and excite the nuclear spins to precession around this alignment using an alternating magnetic field. The precession or return of the spins from this excited state to a state with lower energy generates an alternating magnetic field, which is received via antennae, as a response.

With the aid of magnetic gradient fields, a location coding is impressed on the signals, which subsequently enables an assignment of the received signal to a volume element. The received signal is then evaluated, and a three-dimensional imaging representation of the examination object is provided.

In order to achieve the best possible signal-to-noise ratio (SNR), an attempt is made to arrange the antenna coils for reception as close as possible to the patient. This takes place with local coils that are usually connected to the magnetic resonance tomography unit with cable connections. Due to the high fields when exciting the nuclear spins, defective local coils may, however, also pose a risk to the patient if safety apparatuses fail.

SUMMARY AND DESCRIPTION

The scope of the present invention is defined solely by the appended claims and is not affected to any degree by the statements within this summary.

The present embodiments may obviate one or more of the drawbacks or limitations in the related art. For example, local coils may be made more reliable.

A method according to the present embodiments is provided for checking a detuning facility of an antenna coil of a magnetic resonance tomography unit. With the detuning facility, it is possible to activate the detuning facility using, for example, a control signal. This may be, for example, a DC voltage or a DC current that is applied to the detuning facility, as is customary with PIN diodes or switches. However, the control signal may also be another analog or digital signal that leads to a detuning of the antenna coil in a control facility of the detuning facility.

Activation of the detuning facility within the present embodiments is, however, for example, not considered if a signal (e.g., a high-frequency signal induced in the antenna coil) that itself could lead to a hazard for the patient due to the induced voltage, activates the detuning facility, as is the case, for example, with a passive fuse or Zener diodes. The detuning facility may lead to a displacement of a resonance frequency of the antenna coil, it also being possible to receive a high-frequency signal by a connected receiver. The detuning facility may be implemented, for example, by variable-capacitance diodes or switchable inductances or capacitances in a parallel or series oscillating circuit of the antenna coil. It is, however, possible that the detuning facility also has a passive component that performs a limitation of the induced voltage or current. For example, detuning diodes that are detuned by an induced, rectified voltage without an external control signal or cross-connected diodes or Zener diodes that short-circuit an induced voltage above a limit value may be provided.

In one act of the method, the detuning facility of the antenna coil is activated (e.g., by applying a voltage of one current or by another control signal to the control facility of the antenna coil).

In another act, a receiver receives a first receive signal from the antenna coil with the detuning facility activated. In this case, a high-frequency current and/or voltage signal is regarded as the receive signal, which reaches the receiver processed and/or digitized analogously or also in an analogous manner. For example, the receive signal has information relating to amplitude, phase, and/or spectral distribution. The receiver may be a dedicated receiver for testing the detuning facility. Alternatively, the receiver may be a receiver of the magnetic resonance tomography unit that is also used for receiving magnetic resonance signals for imaging from the magnetic resonance tomography unit.

In a further act, a second receive signal from the antenna coil is received by the receiver. Depending on the embodiment of the method, the detuning facility may or may not be activated. What has already been stated applies to the receive signal and receiver.

In another act, a test controller compares the first receive signal with the second receive signal. The test controller may be, for example, the controller of the magnetic resonance tomography unit or an image evaluation or also a dedicated processor. The comparison of the first receive signal and the second receive signal may be, for example, a difference or quotient formation and comparison with predetermined difference values or quotients, or a relation of mean or maximum amplitudes or energy. The comparison may not be restricted to exact values, but may also be defined by value ranges that are, for example, up to 5%, 10%, 20%, or 50% of one of the two values of the first receive signal or the second receive signal or differ from a value 1 by a factor of less than 0.1, 0.2, or 0.5 in the case of quotients. Further mathematical calculations on these relations may also be provided as part of the comparison. Exemplary embodiments for this purpose are specified below.

If the result of the comparison does not match a predetermined value range, the controller outputs a warning signal via an output device to a user and/or interrupts further image acquisition.

In one embodiment, for example, a temporal change of the input signal, such as attenuation, is dependent on the activated detuning facility and may thus be inferred by comparing the two receive signals to the function of the detuning facility. In one embodiment, a method according to the present embodiments makes it possible to quickly check the detuning device using the magnetic resonance tomography unit.

A magnetic resonance tomography unit according to the present embodiments has a testing facility for testing a detuning facility of an antenna coil of the magnetic resonance tomography unit using a test controller. The test controller may be a dedicated processor or logic module, but may also be a processor of the magnetic resonance tomography unit that performs this task using a program in addition to image acquisition. The test controller is configured to activate the detuning facility of the antenna coil, to receive a first receive signal with a receiver, to receive a second receive signal with the receiver, to compare the first receive signal with the second receive signal, and to output a warning signal if a result of the comparison does not match a predetermined relation for the first receive signal to the second receive signal. The warning signal may, be output, for example, on a display to a user or to the controller of the magnetic resonance tomography unit to stop further image acquisition.

A magnetic resonance tomography unit according to the present embodiments shares the advantages of the method according to the present embodiments.

In one embodiment of the method, the method has an act of deactivating the detuning facility. The act of receiving the first receive signal takes place when the detuning facility is activated, and the act of receiving the second receive signal takes place when the detuning facility is switched off. In the comparison act, a noise level of the first receive signal is compared with a noise level of the second receive signal. For example, the amplitude or energy of the noise may be compared using subtraction or forming the quotient. In one embodiment, the result may be represented by taking the logarithm in a larger dynamic range. A spectral distribution of the energy of the noise caused by a change in a resonance frequency by the detuning facility may also be considered.

The comparison of two receive signals with an activated and with a deactivated detuning facility makes it possible in a simple manner to check a function of the active parts of the detuning facility.

In one embodiment of the method, a transmitter of the magnetic resonance tomography unit emits a small signal during the acts of receiving the first receive signal and the second receive signal. The small signal is regarded as a small signal if the amplitude of the test pulse is sufficiently low to exclude consequential damage to the local coil or risks for the patient in the event of a defect in the local coil, and not to override the receiver. The small signal or the test pulse is therefore to have low or reduced power. In this case, power of less than 0.1 watt, 1 watt, or 5 watts is regarded as reduced power. Reduced power may also be indicated by the amplitude of a test pulse applied to a transmitting antenna, the effective voltage typically being less than 0.5 V, 1 V, 5 V, or 15 V.

For example, a separate signal source may be provided as a transmitter for generating the small signal.

Since the small signal does not override the receiver, it is possible with a method according to the present embodiments to also detect small differences such as, for example, a slight attenuation or a change in spectral distribution when comparing the first receive signal and the second receive signal.

In one embodiment of the method, the transmitter is provided for generating excitation pulses of the magnetic resonance tomography unit for generating the small signal. For this purpose, the transmitter has a switchable attenuating facility between a signal generation and a power output stage, which is configured to attenuate an input signal of the power output stage during the receiving acts such that the transmitter does not override the receiver. For this purpose, the transmitter is to have a correspondingly linear circuit technology in order to be able to generate correspondingly small signal strengths proportionally and with sufficiently small distortions and noise. The switchable damping apparatus may be provided, for example, to lower the input signal by 40 dB, 60 dB, 80 dB, 100 dB or more, so that the transmitter also generates a correspondingly reduced output signal. However, a corresponding attenuator may also be provided on the output side so that the requirements for the linearity of the power output stage are reduced.

The use of the transmitter to generate the excitation pulses when checking the detuning facility enables the tests to be easily integrated into existing hardware.

In one embodiment of the method, the transmitter for generating excitation pulses of the magnetic resonance tomography unit is also provided for generating the small signal. No input signal is supplied during the act of receiving the first receive signal and receiving the second receive signal at the power output stage. In other words, the generation of the excitation signal is interrupted or a signal with a constant output value is generated. In one embodiment, the connection between signal generation and the power output stage may be interrupted, or the input of the power output stage may be connected to a constant potential. The power output stage then generates a noise at the output that is emitted as a small signal in the test method.

The use of the noise of the power output stage makes it possible, according to the present embodiments, to generate and emit a small signal with the transmitter, even without modifications of the transmitter, and thereby facilitate the implementation of a test method according to the present embodiments.

In one embodiment of the method, a signal source is arranged in the patient tunnel as a transmitter for the small signal during the acts of receiving the first receive signal and the second receive signal. The signal source emits a small signal, where the power of the small signal between the act of receiving the first receive signal and the act of receiving the second receive signal changes by a predetermined magnitude. The frequency of the high-frequency alternating field may be equal to the Larmor frequency or in a range close to the Larmor frequency.

A predetermined change in magnitude of the small signal provides a possibility of identifying the small signal and/or eliminating background signals. For example, the effectiveness of passive elements of the detuning facility may also be checked using non-linear behavior of the receive signals.

In an embodiment of the method, an active transmitter of the magnetic resonance tomography unit generates the signal. An active transmitter may be a transmitter or oscillator that not only reflects a radiated high frequency or temporarily stores the radiated high frequency as a high-frequency current in a resonance circuit or in an excited quantum state, and then emits the radiated high frequency, but also generates a high-frequency signal from a current supplied by an energy source via an electrical conductor. The signal is a small signal that does not override the receiver. A test controller controls the transmitter in one act to change the power. For example, a test controller may increase or decrease a gain in the transmitter between receiving the first receive signal and receiving the second receive signal. In one embodiment, the test controller changes an amplitude of an input signal of the transmitter.

Using the test controller, the signal may be changed in a predetermined manner, so that amplitudes may be set in an advantageous manner; the detuning facility and the correct function thereof become noticeable in various ways, for example, through non-linearity or predetermined attenuation or energy absorption.

In one embodiment of the method, the transmitter is a passive signal source (e.g., a resonator or an object with nuclear spins that are temporarily excited by a high-frequency excitation signal of the magnetic resonance tomography unit to emit an alternating magnetic field that then decreases exponentially over time in a predetermined manner as a result of the attenuation). In this manner, between the act of receiving the first receive signal and the act of receiving the second receive signal, a high-frequency signal or magnetic resonance signal that decreases over time is generated as a small signal.

A passive signal source as a transmitter requires no changes or only minimal changes to the magnetic resonance tomography unit and may nevertheless provide a test signal in the desired frequency range of the Larmor frequency and with a smaller amplitude suitable for the receiver.

BRIEF DESCRIPTION OF THE DRAWINGS

FIG. 3 shows a schematic flow chart for an exemplary method according to an embodiment.

DETAILED DESCRIPTION

Figure 1:
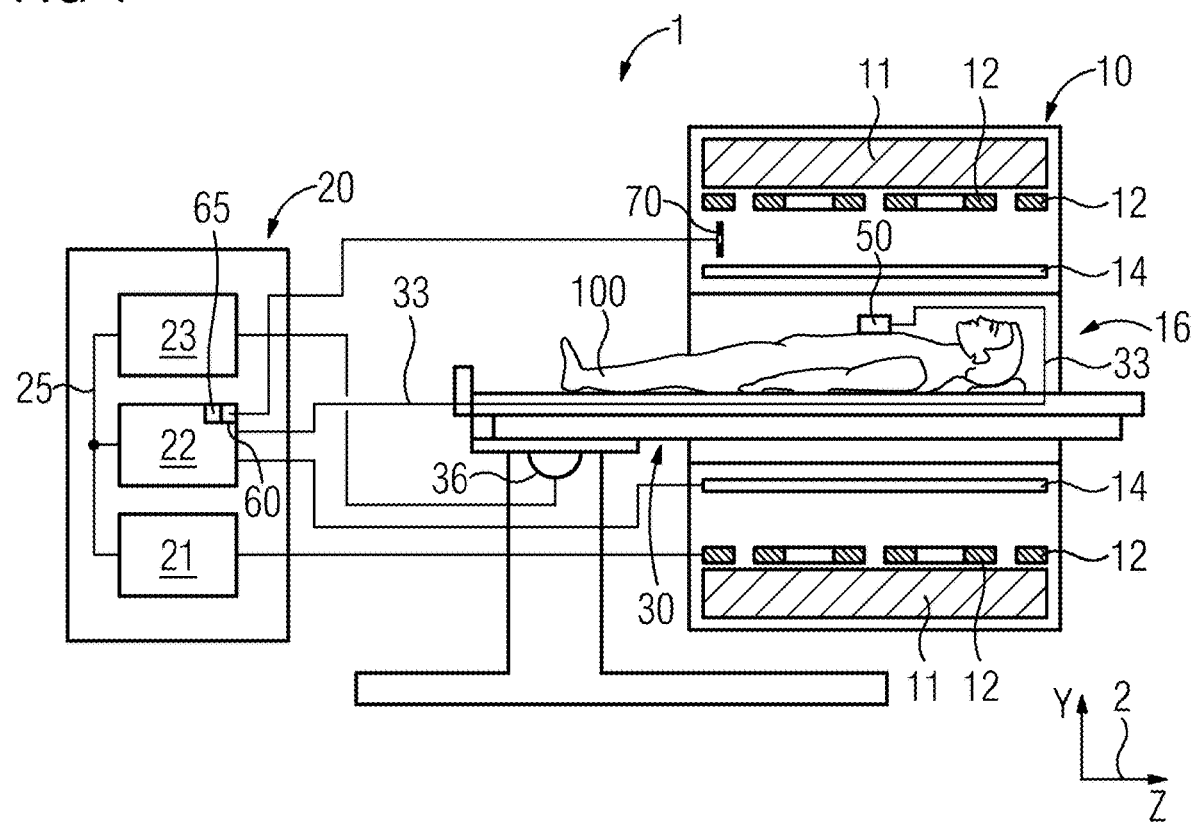
FIG. 1 shows a schematic representation of a magnetic resonance tomography unit with a local coil according to an embodiments.

FIG. 1 shows a schematic representation of an embodiment of a magnetic resonance tomography unit 1 with a local coil 50.

The magnet unit 10 has a field magnet 11 that generates a static magnetic field B0 for aligning nuclear spins of samples or of the patient 100 in a recording region. The recording region is characterized by an extremely homogenous static magnetic field B0; homogeneity relates, for example, to a magnetic field strength or an amount. The recording region is virtually spherical and is arranged in a patient tunnel 16 that extends in a longitudinal direction 2 through the magnet unit 10. A patient couch 30 may be moved in the patient tunnel 16 by a displacement unit 36. The field magnet 11 is usually a superconducting magnet that may provide magnetic fields with a magnetic flux density of up to 3 T, and in the case of the latest devices, even higher. Permanent magnets or electromagnets with normally conducting coils may, however, also be used for lower field strengths.

The magnet unit 10 has gradient coils 12 that are configured to superimpose variable magnetic fields in three spatial directions on the magnetic field B0 in order to spatially differentiate the imaging regions included in the examination volume. The gradient coils 12 are usually coils of normally conductive wires that may generate fields in the examination volume that are orthogonal to one another.

The magnet unit 10 likewise has a body coil 14 that is configured to emit a high-frequency signal supplied via a signal line into the examination volume, and to receive resonance signals emitted by the patient 100 and to emit the resonance signals via a signal line.

A control unit 20 (e.g., a controller) supplies the magnet unit 10 with the various signals for the gradient coils 12 and the body coil 14 and evaluates the received signals.

Thus, the control unit 20 has a gradient controller 21 that is configured to supply the gradient coils 12 with variable currents via supply lines that provide the desired gradient fields in the examination volume in a temporally coordinated manner.

Further, the control unit 20 has a high-frequency unit 22 that is configured to generate a high-frequency pulse having a predetermined temporal profile, amplitude, and spectral power distribution for exciting a magnetic resonance of the nuclear spins in the patient 100. Pulse powers in the range of kilowatts may be achieved. The excitation pulses may be emitted into the patient 100 via the body coil 14 or via a local transmitting antenna.

A controller 23 communicates via a signal bus 25 with the gradient controller 21 and the high-frequency unit 22.

A local coil 50 is arranged on the patient 100 and is connected to the high-frequency unit 22 and a receiver 65 of the high-frequency unit 22 via a connecting line 33.

A defective local coil 50 poses a particular danger to the patient as a result of direct proximity if, for example, a detuning facility for tuning the local coil 50 is defective and excessively high voltages and/or currents are induced in the local coil during the excitation pulse. The local coil 50 is also particularly susceptible to defects due to constant movement, attachment, and loosening of the connection. It is therefore advantageous if the essential functions of the local coil 50 are tested with the magnetic resonance tomography unit in the configuration provided for image acquisition at least before each image acquisition.

Figure 2:
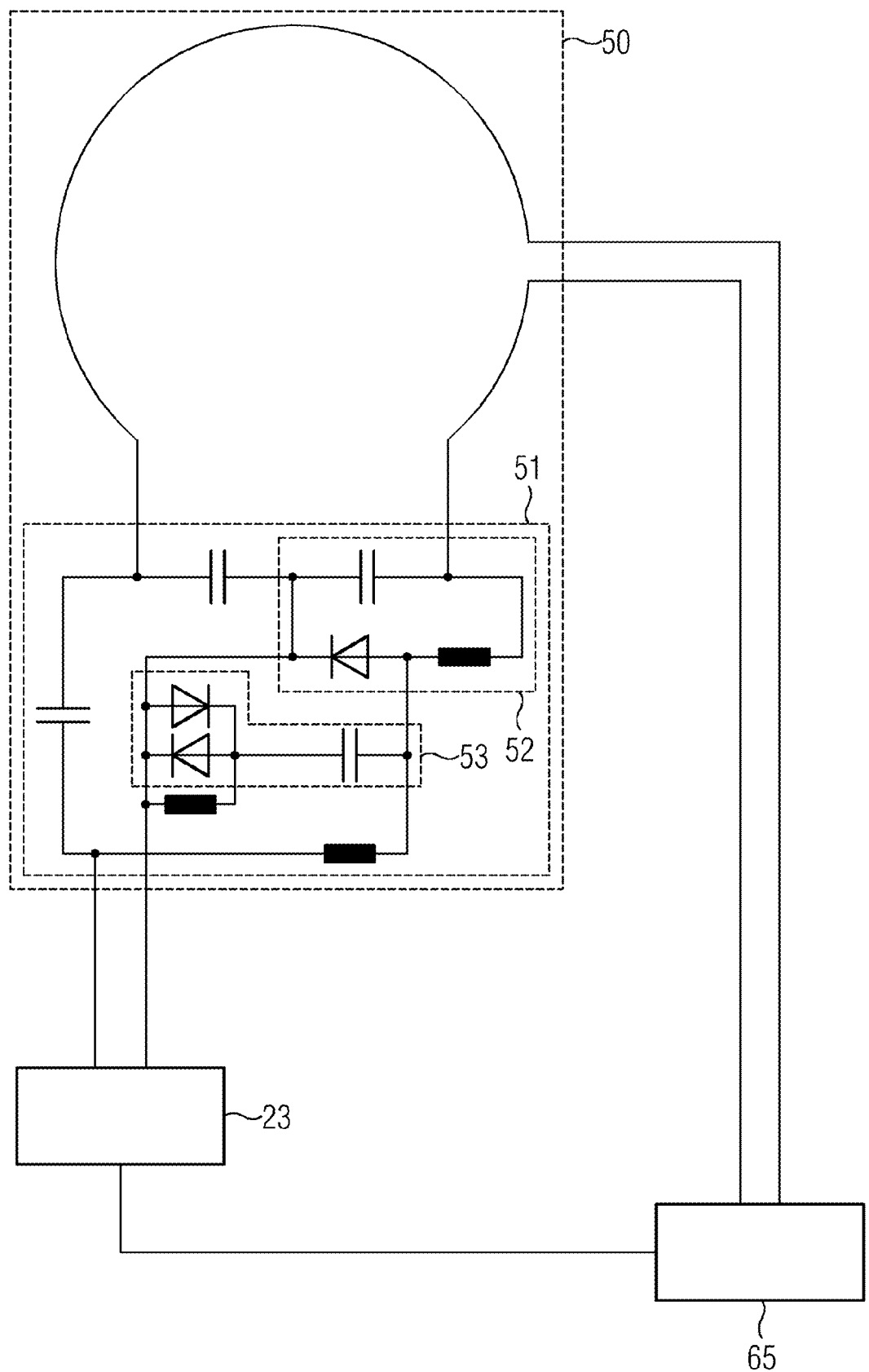
FIG. 2 shows a schematic representation of a testing facility of a magnetic resonance tomography unit according to an embodiment.

In FIG. 2, the elements of the testing facility essential for the method according to the present embodiments are shown schematically in different embodiments.

The local coil 50 has a detuning facility 51 to prevent excessively large currents from flowing in an antenna coil of the local coil 50 during an excitation pulse for the nuclear spins as a result of induction and/or excessive voltages being induced that damage the local coil and, for example, may also endanger the patient as a result of voltage or heat development. The detuning facility 50 may have both passive detuning 53 and active detuning 52. Passive detuning takes place, for example, by two antiparallel diodes so that in the event that the induced alternating voltage exceeds the threshold voltage of the diodes, the two antiparallel diodes become conductive and an additional LC element is looped into the antenna coil in series. As a result of this, the resonance frequency is changed, and the induced voltage is limited.

Active detuning 52 is effected by a PIN diode to which a blocking voltage and/or a forward current may be applied by the controller, so that detuning is effected either by the changed junction capacitance or by the switching action in conjunction with a capacitance and/or inductance connected in series or in parallel.

Other circuits and combinations of the elements of the detuning facility 51 may also be provided. For example, active detuning 52 and passive detuning 53 may be carried out separately without common paths or components. For example, it is the task of a method according to the present embodiments and a magnetic resonance tomography unit according to the present embodiments to be able to check the function of as many components as possible or of all the components.

In FIG. 3, a method according to the present embodiments is shown schematically in a flow chart.

For the method, in act S10, the detuning facility of the antenna coil (e.g., of the local coil 50) is activated by a test controller. The test controller may be the controller 23 of the magnetic resonance tomography unit 1, implemented by a corresponding program or program module. However, dedicated processors or a logic circuit such as a field programmable gate array (FPGA) may also be provided. When activated, active detuning 52 is controlled such that a local coil 50 electrically connected to the active detuning 52 or, for example, a body coil 14 in the activated state no longer resonates at the optimum frequency for receiving. Usually, the optimum frequency is the Larmor frequency of the nuclear spins to be examined in the static magnetic field B0 of the magnetic resonance tomography unit 1. The activation of the active detuning 52 may take place at different times in different embodiments of the method and not only as illustrated in FIG. 3 at the beginning.

A common feature of the different embodiments of the method is that a second receive signal is received with a receiver S50 at two different times in act S20 and in act S50. Different times are considered to be when, for example, a further act of the method takes place between acts S20 and S50 or at least the received signal changes as a result of physical conditions between acts S20 and S50 (e.g., due to an attenuation or a decaying excitation). The two times of acts S20 and S50 therefore differ, for example, by more than 1 ms, 5 ms, 10 ms, 50 ms, or 100 ms.

In act S60, the first receive signal is compared with the second receive signal by the test controller. Comparison may be considered, for example, as a subtraction of the amplitudes or amplitude squares of both receive signals. A phase difference formation or a spectral analysis of the energy distribution over several or many frequencies may be provided. Also, functions such as logarithms applied thereto may be part of the comparison.

In act S70, a warning signal is output if the result of the comparison does not match a predetermined relation for the first receive signal to the second receive signal. Hereinafter, individual examples of signals and expected predetermined relations are given. The warning signal may be output to an operator via an output or also directly to the control unit 20, so that the warning signal interrupts the further image acquisition, for example, in order not to endanger a patient 100 as a result of a defective detuning facility 51.

In one embodiment of the method, in act S30, the detuning facility is deactivated by the test controller. One of the two receive signals is received when active detuning 52 is activated, while the other receive signal is received when active detuning 52 is deactivated. Act S10 may take place, for example, before act S20 and act S30, between acts S20 and S50. The magnetic resonance tomography unit 1 does not emit an active signal during acts S20 and S50 (e.g., the high-frequency unit 22 and/or a test transmitter 60 are not controlled with an input signal). The receive signal is therefore characterized, for example, by a noise signal of an output stage of the transmitter. Therefore, in act S60 of comparing, the noise level of the first receive signal is compared to the noise level of the second receive signal. By active detuning 52, the level and the energy of the receive signal received by the receiver 65 may change in a characteristic manner. This may be connected to or caused by an altered resonance frequency of the antenna or local coil 50. In one embodiment, the comparison may consider a change in the spectral distribution of the noise signal (e.g., using FFT) that results from a convolution of the spectrum of the noise source with the resonance frequency of the antenna, which is altered by active detuning. In one embodiment, the noise signal in the amplitude is so small that passive detuning 53 is not present and only the function of active detuning 52 may thus be checked.

In one embodiment of the method, however, during the acts of receiving S20, S50, a transmitter of the magnetic resonance tomography unit emits a small signal that is configured not to override the receiver.

The transmitter may be the transmitter that is used by the magnetic resonance tomography unit to generate the excitation pulses for the nuclear spins during image acquisition. Usually, however, the transmitter is configured to generate extremely strong high-frequency pulses in the range of several hundred to thousands of watts with high efficiency. In order to generate small signals that do not override the receiver 65, the magnetic resonance tomography unit may have a linear output stage and a switchable attenuating facility between signal generation and the linear output stage. The attenuating facility sufficiently attenuates an input signal of the linear output stage during the acts of receiving S20, S50 in order to generate a corresponding small signal at the output of the linear output stage. In principle, the output signal of a conventional power output stage may also be attenuated; a high level of power may have to be dissipated as power loss of the attenuator, however.

The small signal generated may, for example, be emitted via the body coil 14 as a transmitting antenna into the patient tunnel 16 with the local coil 50 as the receiving antenna.

In one embodiment, a separate test transmitter 60 may be part of the magnetic resonance tomography unit 1. The separate test transmitter 60, controlled by the test controller, generates the small signal and emits the small signal into the patient tunnel 16 with the local coil 50 via a transmitting antenna 70.

In a method according to the present embodiments, active generation of the small signal provides more degrees of freedom when comparing the first receive signal and the second receive signal by changing the power and/or the frequency spectrum between act S20 and act S50. For example, the power of the small signal may be changed to such an extent between acts S20 and S50 that passive detuning 53 already intervenes at the higher power and the level of the receive signal is limited. The function of passive detuning 53 may be checked based on this limitation or a non-linearity for three or more measured values.

In one embodiment, a spectral distribution of the small signal between the acts in order to check a function of active detuning 52 and/or passive detuning 53. Various combinations of different small signals and settings of active detuning that check all the functions of the detuning facility 51 may be provided.

In one embodiment, the nuclear spins may be used as a small signal source even after excitation. For example, a measured value from a previous image acquisition sequence may be used to estimate the strength of an expected magnetic resonance signal and a corresponding temporal profile. In the case of a known spin density and excitation signal, a Bloch simulation of the magnetic resonance signal to be expected may be provided. A typical course is an exponential decay of the magnetic resonance signal. The acts already described may also be carried out by this small signal with a known temporal profile (e.g., a check of active detuning 53), which, in contrast to passive detuning, does not require a minimum amplitude of the small signal for the response of detuning.

The nuclear spins may also be provided via a phantom. If the signal strength is low, the patient may be used as a source of the magnetic resonance signal. Passive resonators such as an oscillating circuit or dipole that are excited by an excitation pulse of the high-frequency unit 22 and have an exponential signal drop predetermined by the quality of the oscillating circuit or dipole may, however, also be provided.

Although the invention has been illustrated and described in more detail by the exemplary embodiments, the invention is not limited by the disclosed examples, and other variations may be derived therefrom by a person skilled in the art without departing from the scope of the invention.

The elements and features recited in the appended claims may be combined in different ways to produce new claims that likewise fall within the scope of the present invention.

Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for checking a detuning facility of an antenna coil of a magnetic resonance tomography unit, the method comprising:
   activating the detuning facility of the antenna coil;
   receiving a first receive signal with a receiver, wherein the first receive signal is a first high-frequency signal;
   receiving a second receive signal with the receiver, wherein the second receive signal is a second high-frequency signal;
   comparing, by a test controller, the first receive signal with the second receive signal; and
   outputting a warning signal when a result of the comparison does not match a predetermined relation for the first received signal to the second received signal.

2. The method of claim 1, further comprising deactivating the detuning facility, wherein receiving the second receive signal takes place with the detuning facility switched off, and
   wherein comparing the first receive signal with the second receive signal comprises comparing a noise level of the first receive signal with a noise level of the second receive signal.

3. The method of claim 2, further comprising emitting, by a transmitter of the magnetic resonance tomography unit, a signal during the receiving of the first receive signal and the receiving of the second receive signal,
   wherein the signal is configured not to override the receiver.

4. The method of claim 3, wherein the transmitter is provided for generating excitation pulses of the magnetic resonance tomography unit and has a switchable attenuating facility between signal generation and a power output stage, the switchable attenuating facility being configured to damp an input signal of the power output stage during the receiving of the first receive signal and the receiving of the second receive signal, such that the transmitter does not override the receiver.

5. The method of claim 4, wherein the transmitter is provided for generating excitation pulses of the magnetic resonance tomography unit, and during the receiving of the first receive signal and the receiving of the second receive signal, no input signal is supplied to the power output stage.

6. The method of claim 1, wherein during the receiving of the first receive signal and the receiving of the second receive signal, a signal source is arranged in a patient tunnel and emits a signal,
   wherein a power of the signal between the receiving of the first receive signal and the receiving of the second receive signal changes by a predetermined magnitude.

7. The method of claim 6, further comprising:
   generating, by a transmitter of the magnetic resonance tomography unit, the signal as the signal source, the signal being a signal that does not override the receiver; and
   actuating, by a test controller, the transmitter, such that the power is changed.

8. The method of claim 6, wherein the signal source is a passive signal source that is excited by the magnetic resonance tomography unit for emitting the small signal, and
   wherein between the receiving of the first receive signal and the receiving of the second receive signal, an amplitude of the signal emitted by the signal source decreases over time in a predetermined manner.

9. A magnetic resonance tomography unit comprising:
   a testing facility operable for testing a detuning facility of an antenna coil of the magnetic resonance tomography unit, the testing facility comprising:
      a test controller configured to:
         activate the detuning facility of the antenna coil;
         receive a first receive signal with a receiver, wherein the first receive signal is a first high-frequency signal;
         receive a second receive signal with the receiver, wherein the second receive signal is a second high-frequency signal;
         compare the first receive signal to the second receive signal; and
         output a warning signal when a result of the comparison does not match a predetermined relation for the first receive signal to the second receive signal.

10. The magnetic resonance tomography unit of claim 9, further comprising a transmitter operable for generating excitation pulses with a switchable attenuating facility,
    wherein during the receipt of the first receive signal, the receipt of the second receive signal, or the receipt of the first receive signal and the receipt of the second receive signal, the test controller is configured to emit a signal with the aid of the transmitter and the attenuating facility, the signal being configured to not override the receiver.

11. The magnetic resonance tomography unit of claim 9, further comprising an active signal source that is arranged in a patient tunnel during the receipt of the first receive signal and the receipt of the second receive signal, the active signal source being configured to emit a signal,
    wherein the test controller is further configured to change a power of the signal between the receipt of the first receive signal and the receipt of the second receive signal by a predetermined magnitude.

12. A method for checking a detuning facility of an antenna coil of a magnetic resonance tomography unit, the method comprising:
    activating the detuning facility of the antenna coil;
    receiving a first receive signal with a receiver;
    deactivating the detuning facility;
    receiving a second receive signal with the receiver, wherein receiving the second receive signal takes place with the detuning facility switched off;
    comparing, by a test controller, the first receive signal with the second receive signal, wherein comparing the first receive signal with the second receive signal comprises comparing a noise level of the first receive signal with a noise level of the second receive signal; and outputting a warning signal when a result of the comparison does not match a predetermined relation for the first received signal to the second received signal.

\* \* \* \* \*